United States Patent [19]

Prang et al.

[11] Patent Number: 4,459,693
[45] Date of Patent: Jul. 10, 1984

[54] METHOD OF AND APPARATUS FOR THE AUTOMATIC DIAGNOSIS OF THE FAILURE OF ELECTRICAL DEVICES CONNECTED TO COMMON BUS NODES AND THE LIKE

[75] Inventors: Joseph A. Prang, Stow; Ronald E. Roetzer, Princeton; Michael W. Schraeder, Boxborough, all of Mass.

[73] Assignee: GenRad, Inc., Waltham, Mass.

[21] Appl. No.: 342,902

[22] Filed: Jan. 26, 1982

[51] Int. Cl.³ ............................................. G01R 31/28
[52] U.S. Cl. .................................... 371/20; 324/73 R
[58] Field of Search ................. 371/20, 15; 324/73 R, 324/73 AT, 73 PC

[56] References Cited

U.S. PATENT DOCUMENTS

| | | | |
|---|---|---|---|
| 3,870,953 | 3/1975 | Boatman et al. | 324/73 R |
| 4,070,565 | 1/1978 | Borrelli | 371/20 |
| 4,186,338 | 1/1980 | Fichtenbaum | 324/52 |
| 4,194,113 | 3/1980 | Fulks et al. | 371/20 |
| 4,228,537 | 10/1980 | Henckels et al. | 371/23 |
| 4,236,246 | 11/1980 | Skilling | 371/27 |
| 4,242,751 | 12/1980 | Henckels et al. | 371/26 |
| 4,290,013 | 9/1981 | Thiel | 324/73 |
| 4,348,760 | 9/1982 | Rice et al. | 371/20 |
| 4,354,268 | 10/1982 | Michel et al. | 371/20 |

OTHER PUBLICATIONS

"L135 LSI Board Test System", Teradyne, Inc., Boston, Mass., Feb. 78, Pub. F691.
"Genrad 2270 In-Circuit Test System" Manual, Genrad, Waltham, Mass.
P. Thompson, Node Forcing Techniques, Marconi Instrumentation vol. 17, No. 2, May 1980, pp. 31-33.

*Primary Examiner*—Charles E. Atkinson
*Attorney, Agent, or Firm*—Rines and Rines, Shapiro and Shapiro

[57] ABSTRACT

This disclosure is concerned with the automatic diagnosis of the failure of tri-state, two-state and other electrical or electronic devices or components connected to common bus nodes through the pulling of such nodes to high or low voltage state levels during the disabling of all devices connected to the common bus node(s) in order to determine if a failed device is interfering with the normal bus operation; and if so, to proceed automatically to compare parametric measurements of the failed common bus node(s) with purposefully failed selected devices, one by one, to locate the device interfering with the normal bus operation.

31 Claims, 10 Drawing Figures

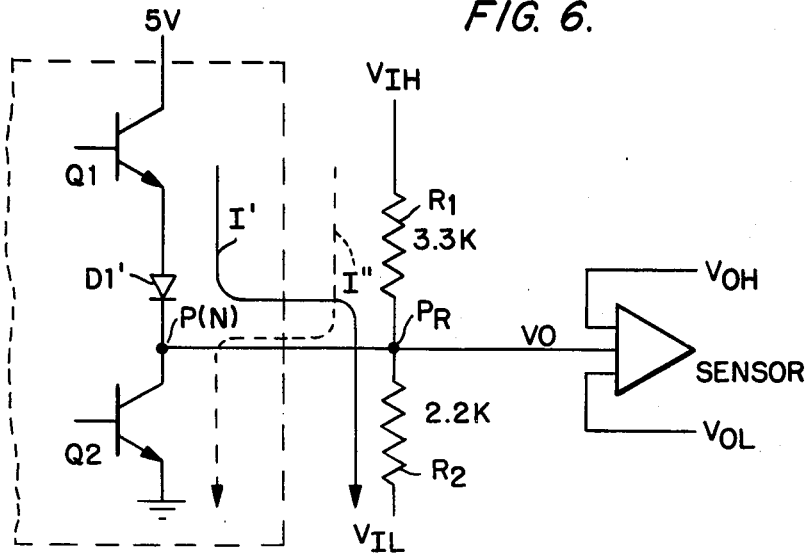
FIG. 6.
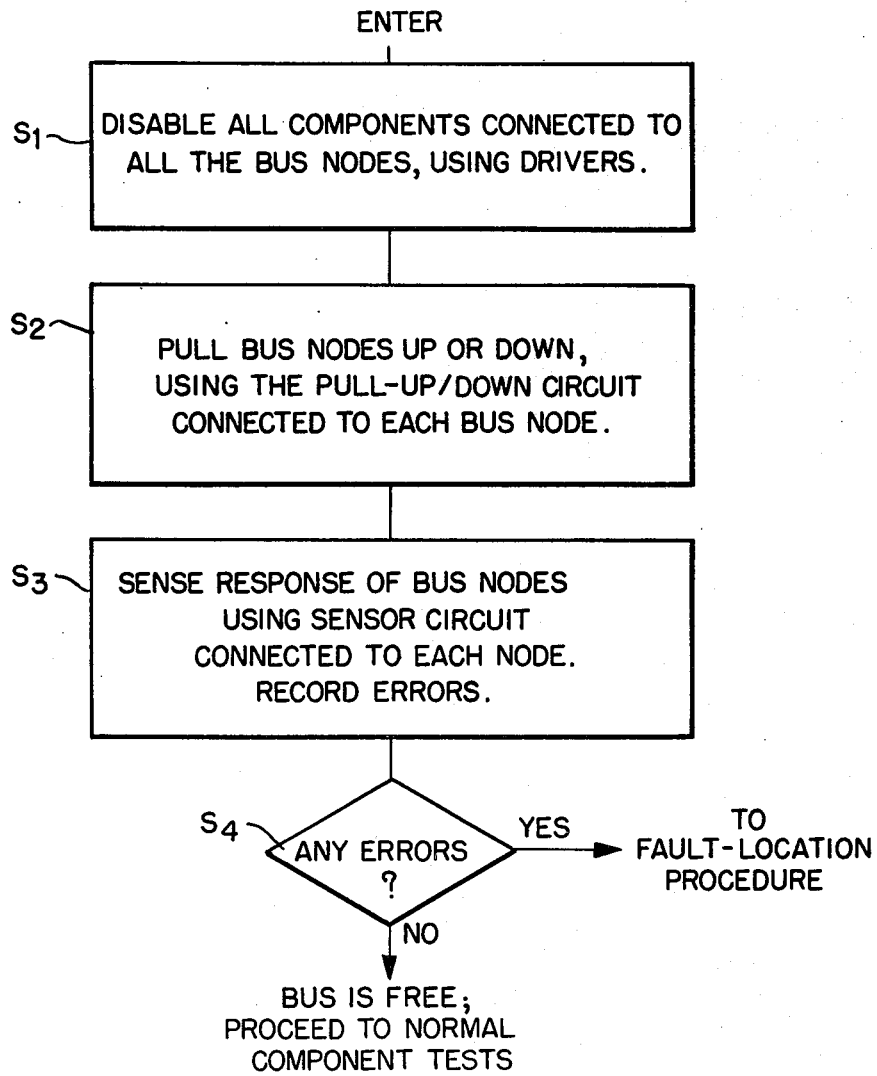
FIG. 7. (COMPUTER CONTROLLED)

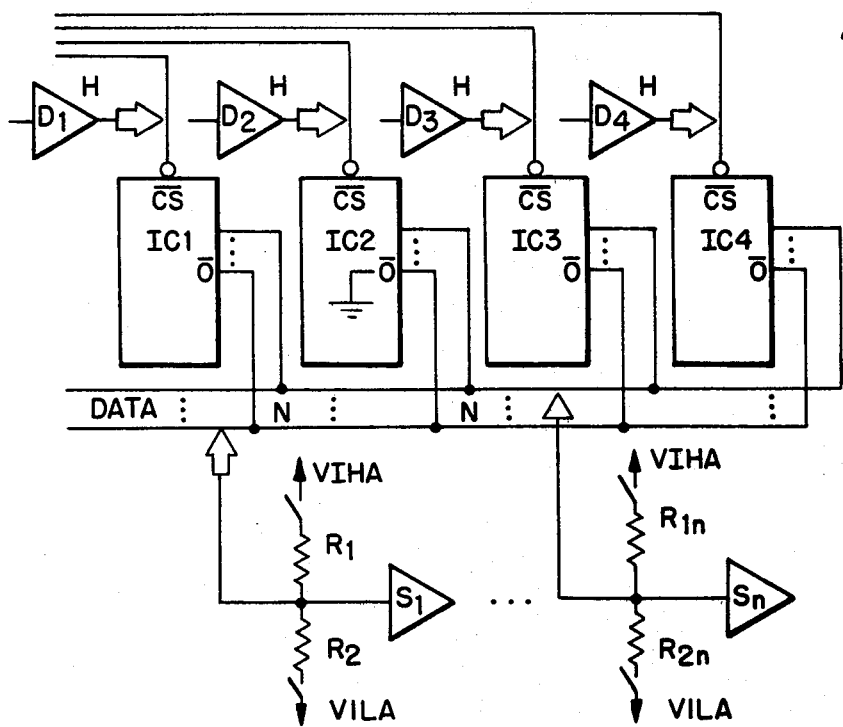
FIG. 8.
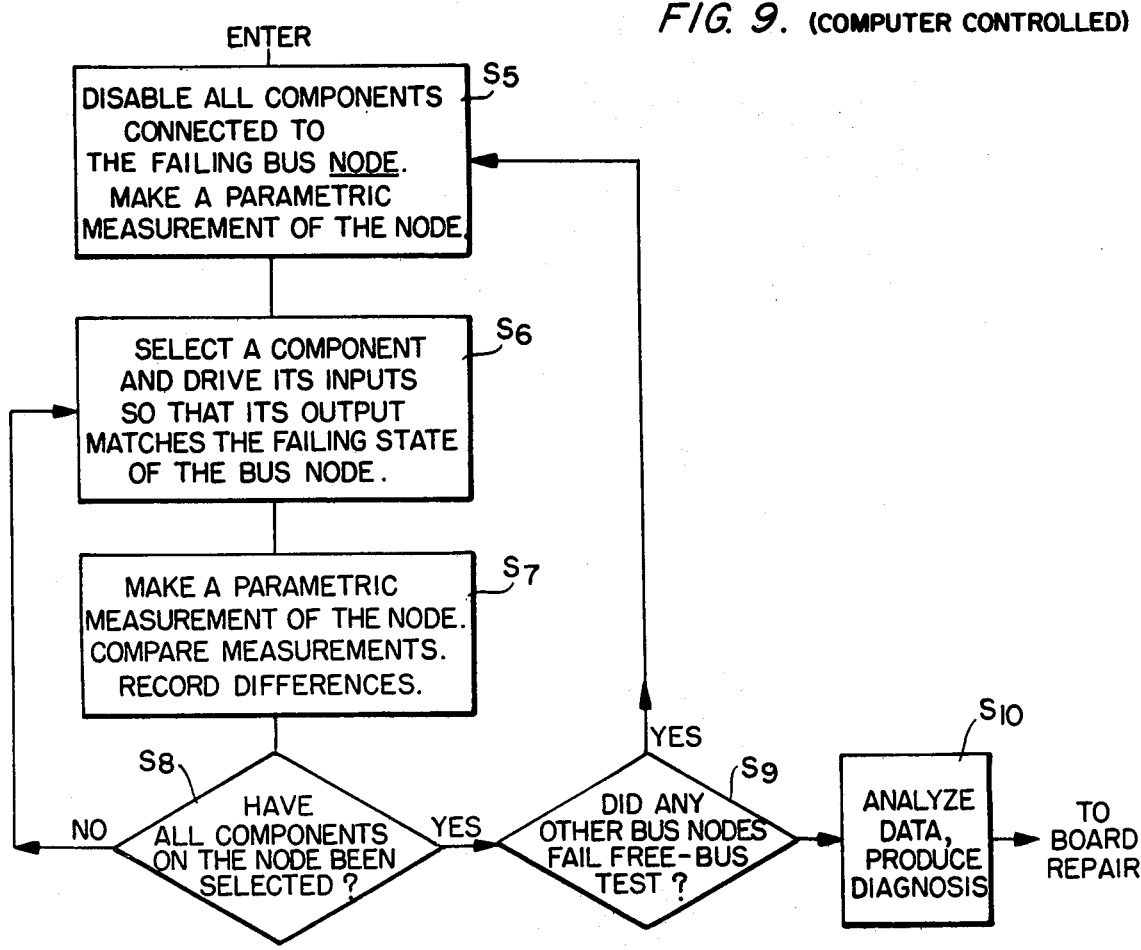
FIG. 9. (COMPUTER CONTROLLED)

METHOD OF AND APPARATUS FOR THE AUTOMATIC DIAGNOSIS OF THE FAILURE OF ELECTRICAL DEVICES CONNECTED TO COMMON BUS NODES AND THE LIKE

The present invention relates to electrical (including electronic) device and component testing and the like, being more particularly directed to systems in which a plurality of such devices are connected to common bus nodes; the invention being concerned with diagnosing an interfering failure on bus nodes and, without the necessity for manual intervention, automatically identifying the particular device(s) causing that failure.

In prior U.S. Pat. Nos. 4,228,537; 4,242,751; 4,236,246; and 4,290,013 of the assignee of the present invention, effective techniques and apparatus are disclosed for incircuit and other testing of electrical circuit boards, integrated circuits (IC's), assemblies and components to determine failing parts and general integrity.

There are numerous applications where pluralities of circuit components and the like, generically sometimes referred to hereinafter as electrical devices, are connected to common points or node(s) of a PCB (printed circuit board) or other signal buses. In such cases, there exists the problem of being sure that none of these devices is interfering with normal bus operation when it is desired to test each device individually or otherwise get access through the bus node to the device. The problem of freeing the bus of the presence of devices and contacting one device at a time also underlies these considerations, as does the problem of obviating the necessity for the operation manually to connect instruments to different points of the system, as with hand-held probes and other connectors, to pin-point the problems.

The addition of intelligence in microprocessor support for circuit testing systems has dramatically increased the number of buses-points where two or more device outputs are tied together. Testing bussed ICs, for example, presents several problems. Each device on the bus must be tested while others are disabled. One failing device on the bus moreover could cause other devices on the bus to appear to fail. Consequently, it can be difficult to determine which device connected to the bus is actually the source of the failure. In the preferred practice of the invention, software solves these problems automatically. First, all bussed nodes are automatically identified from the circuit description. Using programmable pull-up and pull-down resistors along with disable procedures from the IC library, ATG (automatic test generation) software then writes a bus test to verify that the bus is "free." If the bus test passes, then each IC tied to the bus is tested while all others remain disabled. If the bus test fails, a diagnostic technique is used to identify the IC causing the bus failure automatically.

Parametric measurements are made of bus activity to determine which IC on the bus is causing the failure. All tests are written automatically by ATG, and require no probing by the operator, enbling the handling of many types of logic families; and being expandable for custom ICs. The user simply needs to add an enable/disable procedure to the library to set up the bus for the measurements.

Considering, for illustrative purposes, devices of a tri-state or tri-stable character, such as transistor-type components or circuit configurations which have logic 1 and 0 states and an inactive tri-state (as described, for example, in said U.S. Pat. No. 4,236,246) the invention relates to the testing of such and other electrical devices the output pins of which are designed to perform their logical function when tied to a common point, node or PCB track. These tri-stateable or bussed devices belong to many different logic families, such as all types of TTL (transistor-transistor logic), ECL (emitter coupled logic), CMOS (complementary metal oxide semi-conductor), NMOS (N-type metal oxide semi-conductor), etc. In accordance with the invention both test equipment and a methodology is provided to determine, upon receipt of an improper logic state at that common point, which of the devices is causing the failure to occur. Such a determination, as before suggested, is made totally under computer control without manual intervention by the operator of the test equipment to connect instruments to any point on the PCB.

The method and apparatus described herein is particularly useful in a circuit board test system commonly referred to as an in-circuit test system, characterized by its ability to access individual devices on a printed circuit board by contacting tracks or solder lands with a vacuum or mechanical test fixture. The fixture contains probes which touch the board at appropriate track locations so that source (voltage or current inputs) and measurement instruments can be routed there to test devices. In most cases, this allows the tester to monitor responses of devices directly at their outputs in order to determine if they are functioning according to their logical specification, as described in said Letters Patent. In the case of tri-stateable or bussed devices, however, many device outputs share this common track, requiring different methods to be evolved to determine if all devices can be forced to an inactive state, so that, if any one device is activated, the response measured can be directly associated with that activated device.

The ability to deactivate all bussed devices and perform a go/no-go test of the logic state at the common point or node is possible using digital drivers and sensors in the test system. If the go/no-go test fails, however, prior to the present invention, the determination of which device is causing the failure was practically impossible. This is due to the inability of the measurement device to be connected so as to measure the contribution (in terms of DC current) of each device to the previously recorded measured value rather than the sum of all the devices connected to the common point or node.

An object of the present invention, accordingly, is to provide a new and improved method of and apparatus for diagnosing bus device failures and that obviate the above-mentioned problems and difficulties and, more particularly, enable the automatic diagnosis of the failure of electrical devices connected to common bus nodes or the like.

A further object is to provide such a novel method and system that is generically useful with tri-state, two-state and many other types of electrical devices tied to common connection points or nodes.

Still another object is to provide a vastly improved testing technique of more general utility and applicability, as well.

Other and further objects will be explained hereinafter and are more fully delineated in the appended claims.

In summary, however, from one of its viewpoints, the invention embraces a method of diagnosing which of a plurality of electrical devices connected to common bus node means has failed, that comprises, determining whether any of said devices is interfering with normal bus operation; upon determining the presence of such interference, driving a source or sink current through the said bus node means while measuring the same with all said devices disabled supposedly to be inactive; activating one of the devices to drive the said bus node means to a failing state while all the other devices remain supposedly inactive; re-measuring the source or sink current with the said activated device driving said bus node means; comparing the first and re-measured currents to determine if the currents are substantially the same within predetermined limits or different; upon determination that the currents are substantially the same, identifying the failed device as the said one activated device; and if the currents are determined to be different, disabling the said one activated device and activating another of the devices while all the remainder are disabled, and repeating said remeasuring and comparing steps until the failed device is thus identified. Preferred details, apparatus, applications and best mode embodiments are hereinafter presented.

The invention will now be explained in connection with the accompanying drawings, FIG. 1 of which is a block circuit diagram illustrating various currents produced at a common bus node by the presence of a faulty device;

FIG. 6 is a circuit diagram similar to FIG. 2 operating with "Totem Pole" type transistor circuits;

Figure 10:
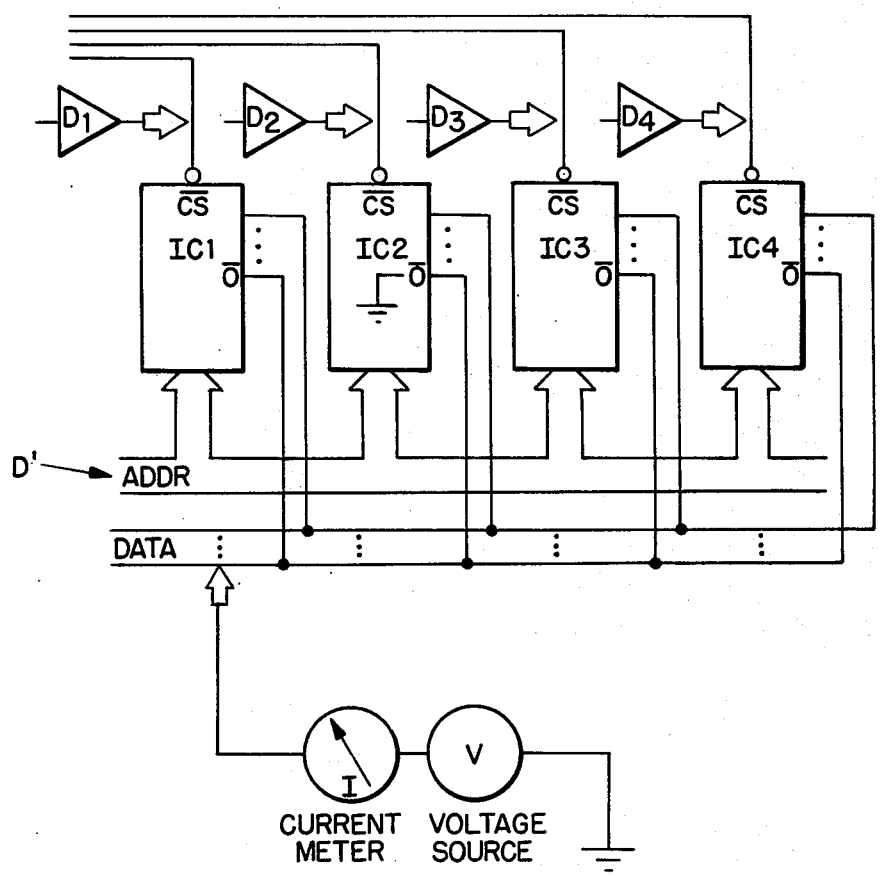

FIGS. 7 and 9 are flow charts for the "free-bus" and fault-location testing steps, respectively; and FIGS. 8 and 10 are circuit diagrams of implementations for practicing the steps of FIGS. 7 and 9, respectively.

Figure 1A:
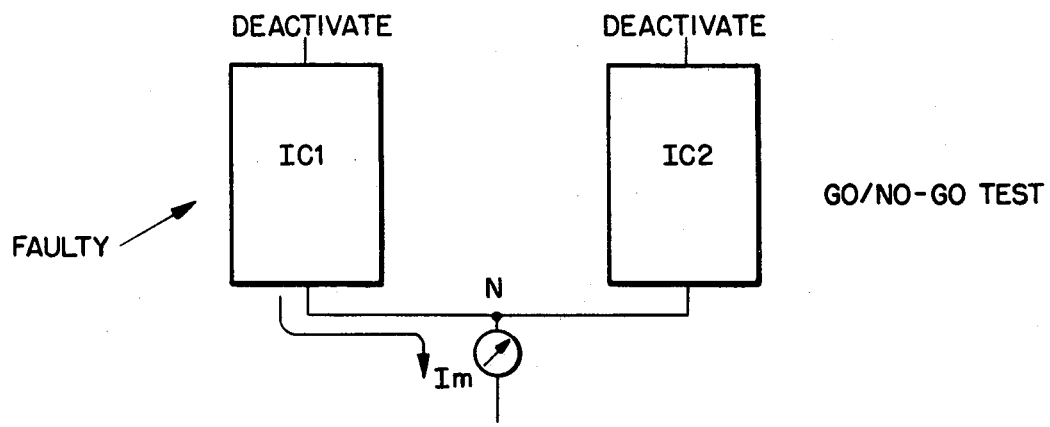
Figure 1B:
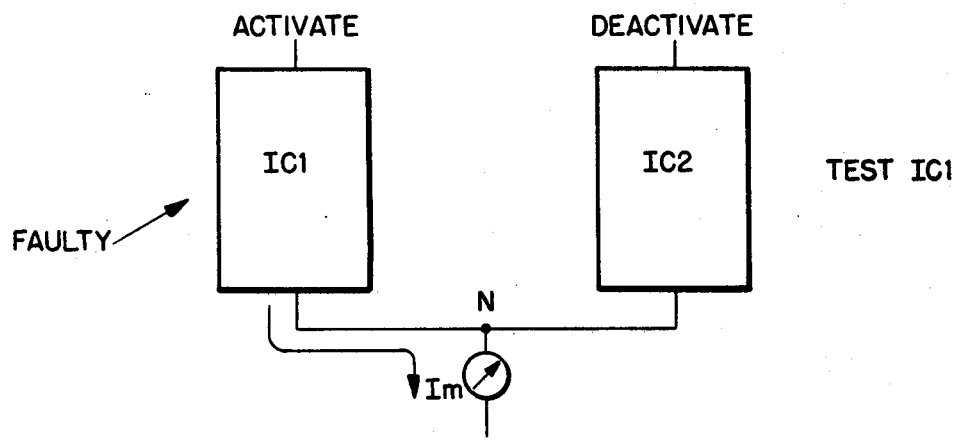
Figure 1C:
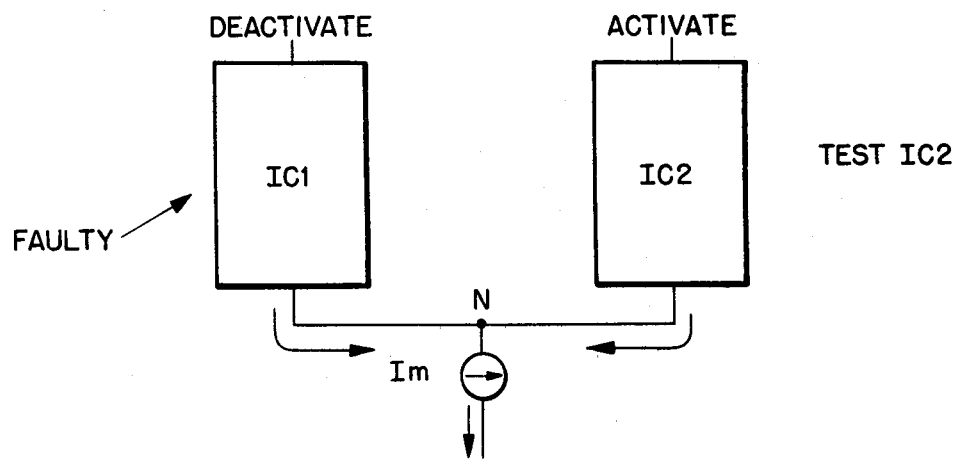

The invention is to be contrasted from the before-mentioned techniques used in functional test systems for attaining improved "visibility" to device outputs tied to a common track point or node, as with the aid of hand-held probes and the like (U.S. Letters Pat. No. 4,186,338, the GenRad, Inc. Manual of DRM-Diagnostic Resolution Module, or the Teradyne Electronic Knife described in "L135 LSI BOARD TEST SYSTEM," Teradyne, Inc., Boston, Mass., Feb. 78, publication F691.), and in which elements of a PCB are typically contacted from connectors at the edge of the card to make measurements of the contribution of each device. The different philosophy of the invention can be simply explained with reference to FIGS. 1A–C, showing two exemplary devices, such as integrated circuits or the like, IC1 and IC2, the outputs of which are tied to a common point or node N, and wherein it is assumed for illustrative purposes that the device IC1 is faulty. FIG. 1A demonstrates that under circumstances of disabling or deactivating both devices, the faulty device IC1, unlike the good device IC2, can cause a current Im to flow through the point N by virtue of its faulty character. Upon activation of IC1 only, FIG. 1B, similarly such current flows; whereas upon activation of IC2, with IC1 supposedly disabled or deactivated, as in FIG. 1C, the current Im will be the sum of contributions from the faulty IC1 and the activated IC2. The procedure involved in the sequence of FIGS. 1A–C thus involves: first, the indicated failure of a go/no-go test (FIG. 1A) wherein it is indicated that some device cannot be disabled or forced to the inactive state by driver deactivation; and then the activation of each device individually, measuring its current flow. The devices which were inactive during the tri-state test, and hence are functioning correctly, will add to the measured tri-state current measurement when they are activated (FIG. 1C). Only the faulty device, when activated, FIG. 1B, will show the same current measurement as that present when all devices are forced to be inactive, FIG. 1A. Thus, under computer control, the test system can automatically identify which device is making it impossible to make response measurement for device tests at the common track point N.

Figure 2:
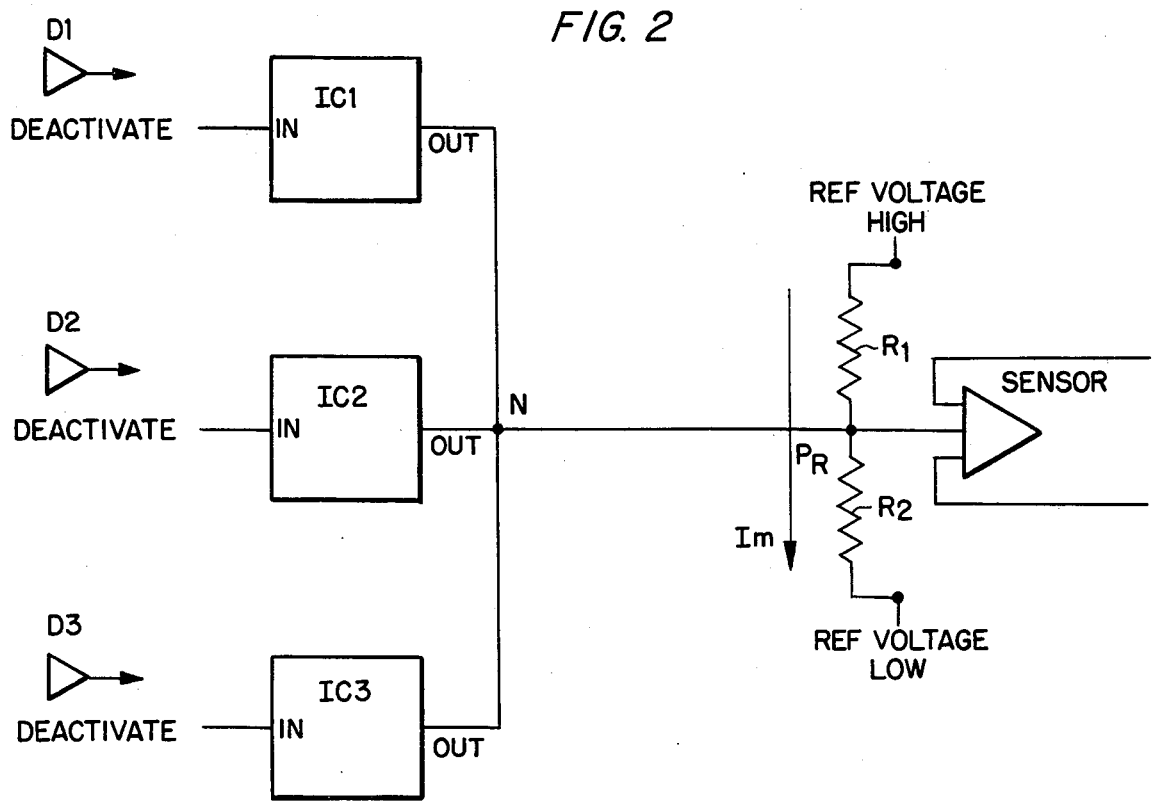
FIG. 2 is a similar diagram of apparatus for effecting a "free-bus" test.

More specifically, in FIG. 2, an illustrative elementary tri-stated common bus node system is simply presented involving three devices, IC1, IC2 and IC3, each having inputs "IN", controlled by respective drivers $D_1$, $D_2$ and $D_3$ (activating or enabling, for example, with "0" state signals) and with the outputs "OUT" connected to the common bus node N at which output currents may be monitored in a sensor, so-labelled. In accordance with the invention, it is first necessary to find out if a device is interfering with normal bus operation (a so-called "free-bus" test), somewhat analogously to the problem in a multi-party telephone line where only one user can talk at a time and where, in effect, this test asks all users to hang up and then determines whether, by error, someone is still on the line. If the bus is "free," the testing can move on to checking the operability of the devices (circuit components). If there is a bus fault indicated, however, a second part of the bus-testing procedure is instituted to find out which device is introducing the interfering fault—which of the party-line users is off-hook, in the telephone line analogy.

Returning to the "free bus" part of the procedure, the initial step in the process of testing the node point N common to such a plurality of bussed devices IC1, IC2, IC3, etc. is to stimulate each of the devices by their respective drivers on their enable/disable or deactivate lines with the appropriate voltage level (Logic "1" or "0") to cause the output "out" of each device to become inactive or disabled (Tri-State), FIG. 2.

Next, voltage level pull-up/pull-down resistors $R_1$, $R_2$ (FIG. 2) are connected at $P_R$ to the bus node N and to reference voltages labelled "High" and "Low," respectively. Measurements are made to see if the voltage level at the node N can be controlled by the resistors and the reference voltages, or, if one of the supposedly inactive devices is truly active (through being faulty) and is forcing a different voltage level on the bus. The condition of deactivation of good IC's is shown in FIG. 2 with the voltage level at N controlled by current Im from the reference voltage resistor network. But in FIG. 3, the interfering faulty IC (IC3) is forcing the bus voltage level as indicated by the path of Im.

Having determined that a fault exists on the bus node (FIG. 3), the reference voltage network may be disconnected and instrumentation automatically routed to the failing bus node (as indicated by the current meter I and voltage source V in FIG. 4), and a parametric measurement is made of the source or sink current Im present when all devices are stimulated to be disabled into the inactive state. This will record the current present at the bus node N due to the faulty device IC3 which, though supposedly disabled, will not assume the inactive state because of its faulty condition.

Next, in accordance with the technique of the invention, not yet knowing which device has failed or is faulty, one of the devices that drives the bus node N is selected and activated via the appropriate logic level at its enable line (shown as IC1 in FIG. 5), while all others are still stimulated to remain in the inactive state. In addition, the inputs of the activated device IC1 are stimulated so that its output out which drives the common bus node N being tested is driven to the failing logic state (i.e. bus high failure-drive output high; bus low failure-drive output low). A parametric measurement of the source or sink current Im is made in FIG. 5 with the activated device IC1 purposely driving the bus. This device, of course, may or may not be (and in FIG. 5 is not) the faulty device which drove the bus when stimulated to the inactive state, FIG. 3.

Figure 4:
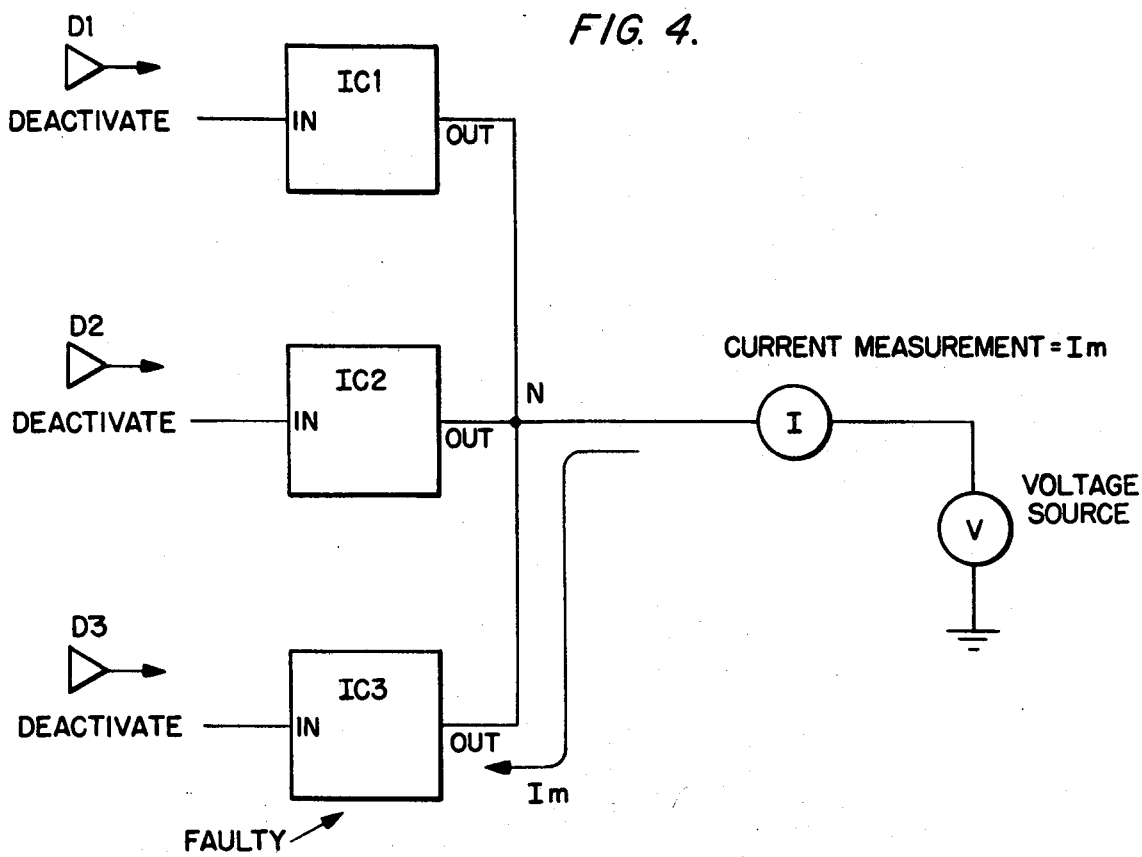
FIGS. 4 and 5 are similar views of apparatus for effecting subsequent faulty device location steps.
Figure 5:
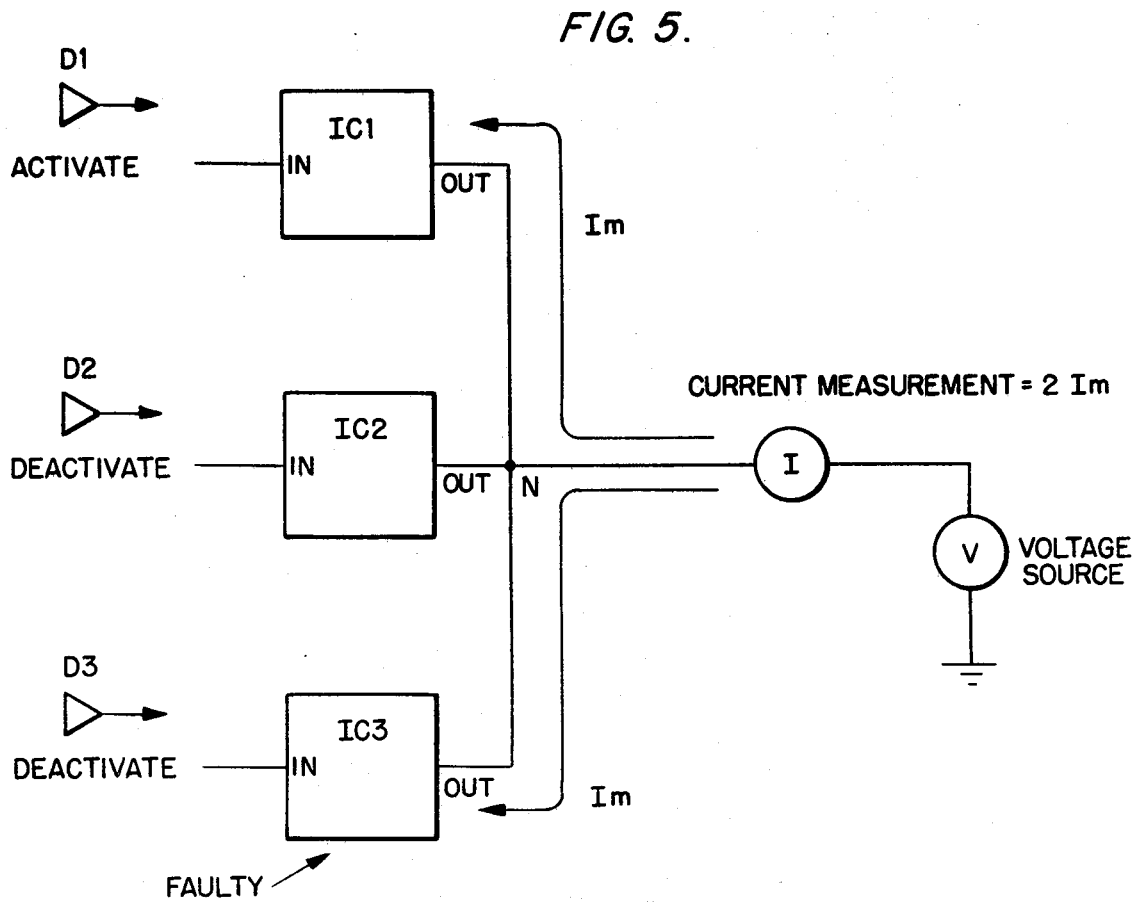

Finally the two current measurements of FIGS. 4 and 5 are compared. If the two differ by a prescribed amount or an amount outside predetermined limits, the activated device is not the one which caused the failure when all devices were stimulated to be inactive. If the currents are substantially the same (or within predetermined limits), the activated device is the faulty device which caused the initial test with all devices inactive to fail. In the case of FIGS. 4 and 5, where the activated device IC1 of FIG. 5 is not the faulty device interfering with normal bus operation, but where IC3 is the faulty device though this is not yet known, the measured parameters (current) in FIGS. 4 and 5 are decidely different (Im vs. 2Im) so that the selection of IC1 to activate and stimulate to failure did not identify the faulty device. Under the technique of the invention, another device would be selected (say, IC2) for activation and driving to failure, while all other devices are disabled or rendered inactive, and the measurement of FIG. 5 and the comparing with the measurement of FIG. 4 repeated—again with different results. Now, IC3 would be selected and, by repeating the same process, with the current measurement of FIG. 5 measuring the same as that of FIG. 4, will be identified as the faulty device.

In practical operation, most digital devices of the TTL, ECL, NMOS, etc. varieties drive the connected point between themselves and interconnected devices by activating and deactivating transistors tied to reference voltages. In FIG. 6 such a typical totem pole transistor network is illustrated having an upper transistor Q1 the emitter of which is connected through diode D1' at P to the collector of transistor Q2, that point of connection P being connected to the intermediate point $P_R$ of the reference voltage resistor network R1–R2. Depending on the logic state (1 or 0) required at the output, Q1 will source current into the output (Logic 1) or Q2 will sink current from the output (Logic 0). Thus, values for the current are typically in the microamp range for the source condition, and the milliamp range for the sink condition. The value is dependent on the device type and the number of interconnected devices. In practice, only one device is designed to drive the connection point.

In bus structured type of devices, it is possible electrically to bias the totem pole transistors Q1–Q2 so that no device will source or sink current at the connecting point P. This makes it possible for a multitude of devices to share a connecting point and improve the density of designs. However, a typical fault condition is the inability of a device (or devices) to respond correctly to the transistor turn-off signal (called a "disable") due to a defective device, a bent pin on that device or other cause. Thus, when the pull-up or pull-down resistor is connected to the bus node N (or P), the transistor that is "stuck" in the "on" condition controls the voltage at the node and forces the failure of the go/no-go bus test. The current line I' in FIG. 6 is for the condition of $Q_1$ stuck "on", and the line I'' is for $Q_2$ stuck "on".

After the go/no-go test, the pull-up or pull-down resistors (R1/R2) are removed, as before explained and instruments are connected to set up a source of sink current for the faulty totem pole transistor $Q_1$ or $Q_2$, FIG. 6. For reference voltage $V_{IH}$ of 5 volts and $V_{IL}$ of 0 volts, $R_1$ and $R_2$ may have respective values of 3.3K and 2.2K ohms. Typically, the values measured will be of the order of about 5 MA when the source transistor is "stuck" and 50 MA when the sink transistor is "stuck." A device which drives the bus is enabled, while simultaneously applying at one or more other pins (typically inputs) patterns to force the output transistor to activate in the failing direction, as previously described in the earlier embodiments.

A typical software or computer program for a test procedure model, couched in terminology understandable by programmers, is as follows:

```
OCTAL BUFFER/LINE DRIVER/RECEIVER*/
.HEAD;
                        .SIZE 20;
                        .INPUT ( 1 1 1 1 19 19 19 19=EN1, 2 4
                           6 8 17 15 13 11=INP):
                        .TRI(18 16 14 12 3 5 7 9=OP);
.END HEAD;
.DISAB(OP):
                        IH(EN1):
                        .HOLD(EN1);
.END DISAB;
.INH(OP);
                        IL(INP,EN1);
                        .HOLD(INP,EN1);
.END INH;
.INH(OP);
                        IH(INP) IL(EN1);
                        .HOLD(INP,EN1);
.END INH;
.INH(OP);
                        IL(INP);
                        .HOLD(INP);
.END INH;
.INH(OP);
                        IH(INP);
                        .HOLD(INP);
.END INH;
.LFORCE(OP);
IL(EN1) IH(INP);        HFORCE
.END LFORCE
.HFORCE(OP);
IL(EN1,INP);
.END HFORCE;            HFORCE
.MAIN;
                        $IC(INP,EN1) OS(OP);
                        PL(INP) OV(OP=.NOT.INP);
                        PH(INP) OV(OP+.NOT.INP);
                        ID(INP,EN1) OI(OP);
.END MAIN;
```

The before-mentioned patterns for forcing the output transistor to activate in the failing direction are indicated in this procedure at HFORCE and LFORCE.

Figure 3:
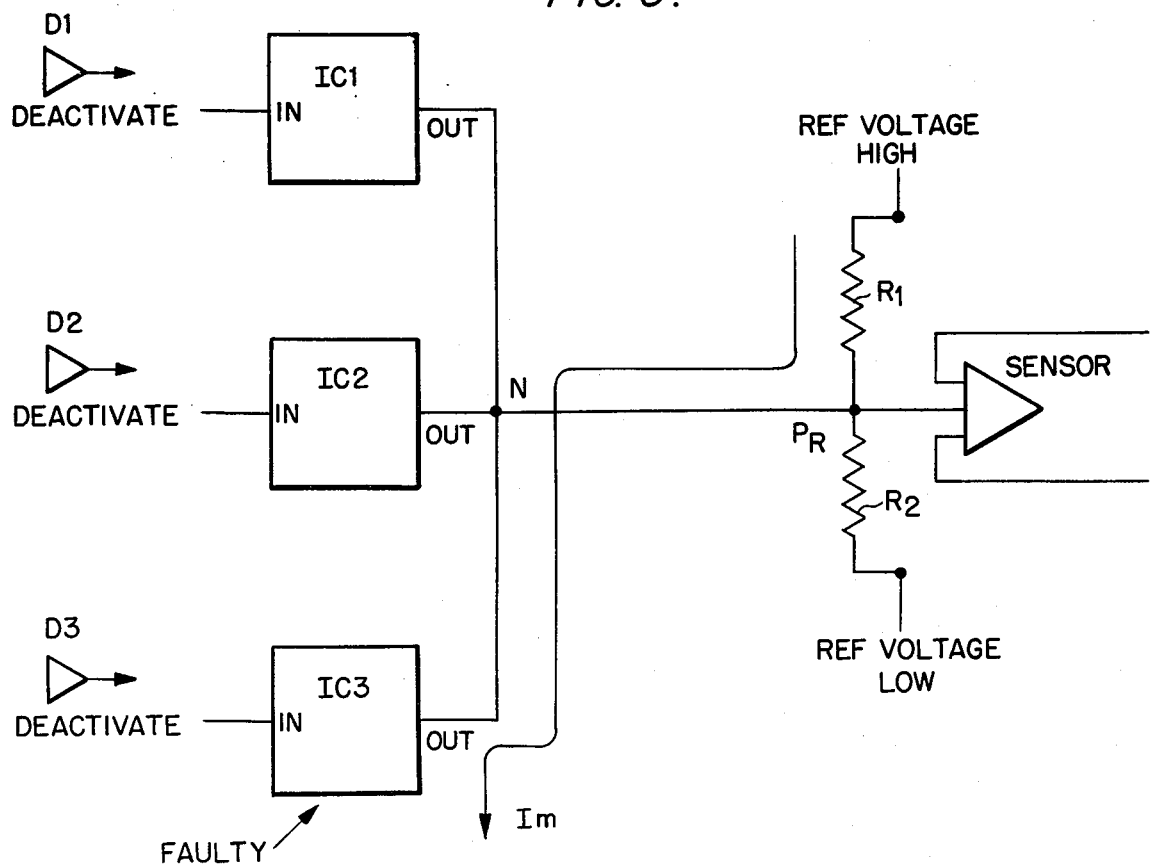
FIG. 3 illustrates the operation of the circuit of FIG. 2 with a faulty device present.

As previously described with the more rudimentary circuits of FIGS. 3–5, the values of current measurements at the bus node P (or N) with both devices Q1 and Q2 supposedly disabled and with one device enabled and driven in the failing direction are compared to determine if the latter exceeds the first by a predetermined limit or differential, which is programmable in the microprocessor by the user. If the limits, percentage or differential is not exceeded, the device is indicated as faulty since a significant percentage of the current measured in the go/no-go test was due to that device. This procedure, as earlier explained, can be repeated for all devices connected to the bus node to determine if multiple faulty devices are present, as well.

Thus, the method and apparatus of the invention diagnose a failure on tri-stateable bus nodes; and then, without manual intervention, identify the device causing that failure. Conditions present on these tri-stateable nodes are measured by instruments and sensors which access the node via a mechanical fixture contacting each track on a printed circuit board and controlled by software to measure voltage and current conditions at the tri-state node. Each device attached to the tri-state node is caused to change from an inactive (tri-state) condition to an active state, one at a time. Once the change has occurred, further measurements are made to determine whether a change in conditions has occurred from that present when all devices were programmed to the inactive state. That device which causes no appreciable changes in the conditions at the tri-stateable node is identified as the cause of the failure. Computer-controlled instrumentation in this configuration selectively activates and deactivates tri-stateable devices to change conditions at the particular bus node.

The invention, however, is not restricted or limited to use with tri-stateable bus node applications. It is equally useful, for example, with open-collector buses (OCL) in which bus-connected logic components pull the bus node only to the low state. A resistor, external to the logic components, will then be used to pull the bus node voltage level to the high state when all logic components are not pulling low. This, in effect, is a two-state bus operation. With open-collector buses, moreover, it is not necessary to establish a reference voltage from the previously described "free-bus" part of the test (as in FIGS. 2 or 6), since the resistor part of the bus under test does this. The reference voltage measurement can be made directly to determine the presence of a fault. It may also be noted, furthermore, that the tri-state bus can also sometimes be self-biasing if desired. Similarly, emitter-coupled logic (ECL) or open-emitter buses can employ the invention; in this case, similarly to the above-described open-collector buses except that the logic devices only pull high, and the "free bus" is low.

While the invention has been described in connection with a single common bus node or the like and plurality of devices connected thereto, this was for illustrative and explanatory purposes only. Many bus systems employ eight or more nodes and it is desirable to run the bus tests of the multiple nodes simultaneously, particularly since logic components communicate on all leads of the bus at once. Parallel or simultaneous multiple bus-node testing is advantageously effected with the invention, as more particularly delineated in the flow charts of FIGS. 7 and 9, and the respective circuit implementations thereof of FIGS. 8 and 10.

FIG. 7 describes the initial steps of the "free-bus" test procedure part before explained ($S_1$-disabling all devices or components; $S_2$-pulling bus node voltages up/down; $S_3$-sensing response to determine "errors" in the sense that pulling is not controlling the bus node voltage levels), resulting either in the determination at $S_4$ that the "Bus is free," or that there is a faulty device(s) connected to the bus node(s) which then must be sought out and identified ("To fault-location procedure"). The implementation for multiple-simultaneous common bus node (parallel) operation illustrated in FIG. 8 embodies devices IC1, IC2, IC3, IC4 . . . , etc. with associated drivers $D_1, D_2, D_3, D_4, \ldots$, etc., respectively, as previously described, which cause the devices to disconnect from the DATA bus to enter the inhibit (or disabled or deactivated) state. The pull-up/down resistor networks $R_1/R_2 \ldots R_{1n}/R_{2n}$, which may be part of the driver-sensor circuits are used to bias the bus nodes N in such a way that any device left connected will be detected by the sensors $S_1 \ldots S_n$. This is a "parallel" test in the sense that the bus nodes are tested concurrently. The number of bus nodes that can be tested in parallel depends upon the number of bus-connected components that can be simultaneously put in the inhibit or inactive state—a characteristic of the structure of the circuit under test.

If the bus nodes are found not to be "free," the further testing outlined in FIG. 9 is performed to determine the faulty device(s), as before explained for a single common bus node. Step $S_5$ represents disabling all devices (or components) connected to the failing bus node and making a parametric (such as current) measurement of the node. The selection of a device to activate and drive to failing state is outlined as step $S_6$, with a parametric measurement node at $S_7$ and comparison of the measurements for similarity (indicating location of the faulty device) or differences, requiring repetition with other selected devices controlled at $S_8$. If all devices have been tested with measurement differences still resulting in this parallel-testing application, then it would be determined if other bus nodes failed the free-bus test ($S_9$), and then repeating with step $S_5$. When the faulty device has been located, its fault can be diagnosed ($S_{10}$) as described in said Letters Patent and by other well-known procedures, and the circuit board repaired.

The implementation for the procedures of FIG. 9 is delineated in FIG. 10 wherein the drivers $D_1 \ldots D_4 \ldots$ etc. cause the devices to be enabled/disabled as previously outlined. Other drivers (not shown, but schematically represented at D') are connected by way of an address bus, ADDR, to apply inputs that change the output states (at $\bar{o}$) of the devices IC1 . . . IC4 . . . etc. applied to the DATA bus. The parameter (current) measuring meter is shown at I, as before. The procedure can either proceed one bus node at a time; or, by repeating the measurement apparatus, the current meter I and voltage source V for each node, or switching an adequate number of the same to the nodes, the nodes may be dealt with simultaneously or in parallel.

The technique of the invention may, as before explained, be implemented with existing in-circuit or other testing systems, including, for example, the Gen-Rad 2270 System of the assignee of the present invention, reference being made to the GenRad Manuals of 1980-1 for such equipment and to said Letters Patent and the reference mentioned therein, providing further microprocessor and other implementation details of such systems.

Further modifications will also occur to those skilled in this art and such are considered to fall within the spirit and scope of the invention as defined in the appended claims.

What is claimed is:

1. A method of diagnosing which of a plurality of electrical devices connected to common bus node means has failed, that comprises, disabling all said devices to cause the output of each operative device to assume an inactive state; applying reference voltage through resistive path means to the common bus node means; determining whether the voltage level at said bus node means is controlled by said resistive path means and reference voltage, of if a supposedly inactive device has failed and is thus actively forcing a different voltage level at said bus node means; upon finding the forcing of such different voltage level, disconnecting said resistive path means and reference voltage from said bus node means; driving a source or sink current through the said bus node means while measuring the same with all said devices supposedly disabled; activating one of the devices to drive the said bus node means to a failing state while all the other devices remain supposedly inactive; re-measuring the source or sink current with the said activated device driving said bus node means; comparing the first and re-measured currents to determine if the currents are substantially the same within predetermined limits or different; upon determination that the currents are substantially the same, identifying the failed device as the said one activated device; and if the currents are determined to be different, disabling the said one activated device and activating another of the devices while all the remainder are disabled, and repeating said re-measuring and comparing steps until the failed device is thus identified.

2. A method as claimed in claim 1 and in which said substantially the same currents are currents either substantially identical or currents lying within a predetermined limited differential, and said different currents lie outside said differential, enabling the identification of multiple faulty devices.

3. A method as claimed in claim 2 and in which said electrical devices are tristable, having logic 1 and 0 states and an inactive tristate, with the said disabling being effected by enabling or disabling through appropriate logic state stimulation; and said activating of the said one device is effected while driving the said bus node means to one of high and low bus failure.

4. A method as claimed in claim 2 and in which the said devices are connected to bus node structures so that no device serves to provide source or sink current at the point of connection to said bus node.

5. A method as claimed in claim 2 and in which said electrical devices include transistor-type devices embodying collectors and in which the further steps are performed of coupling said collectors through appropriate logic to said bus node means to form open-collector buses in which said devices only pull the bus node means to a low state level, and said applying of voltage through resistive path means pulls the bus node means to a high state level.

6. A method as claimed in claim 5 and in which the application of reference voltage through resistive path means is effected through the resistor part of the bus means under test.

7. A method as claimed in claim 2 and in which said electrical devices include transistor-type devices embodying emitters and in which the further steps are performed of coupling said emitters through appropriate logic to said bus node means to form open-emitter buses in which said devices only pull the bus node means to a high state level, and said applying of voltage through resistive path means pulls the bus node means to a low state level.

8. A method as claimed in claim 2 and in which said bus node means comprises a plurality of nodes and the steps of claim 2 are carried out concurrently in parallel at said plurality of nodes.

9. A method of diagnosing which of a plurality of electrical devices connected to common bus node means has failed, that comprises, driving a source or sink current through the said bus node means while measuring the same with all said devices disabled supposedly to be inactive; activating one of the devices to drive the said bus node means to a failing state while all the other devices remain supposedly inactive; re-measuring the source or sink current with the said activated device driving said bus node means; comparing the first and re-measured currents to determine if the currents are substantially the same within predetermined limits or different; upon determination that the currents are substantially the same, identifying the failed device as the said one activated device; and if the currents are determined to be different, disabling the said one activated device and activating another of the devices while all the remainder are disabled, and repeating said re-measuring and comparing steps until the failed device is thus identified.

10. A method as claimed in claim 9 and in which said determining step comprises determining whether the current level at said bus node means is controlled by reference voltage applied thereto while all said devices are disabled or by the forcing of a voltage level at said bus node means by a failed supposedly disabled device.

11. A method as claimed in claim 10 and in which said electrical devices are tristable, having logic 1 and 0 states and an inactive tristate, with the disabling of said devices being effected by enabling or disabling through appropriate logic state stimulation; and said activating of the said one device is effected while driving the said bus node means to one of high and low bus failure.

12. A method as claimed in claim 11 and in which the tristable bus is operated self-biasing.

13. A method as claimed in claim 10 and in which said electrical devices include transistor-type devices having collectors coupled through logic to said bus node means to form open-collector buses in which said devices only pull the bus node means to a low state level, and the applying of said reference voltage is effected by pulling the bus node means to a high state level, operating effectively as a two-state bus.

14. A method as claimed in claim 13 and in which said reference voltage is established by the resistor part of the bus under test.

15. A method as claimed in claim 10 and in which said electrical devices include transistor-type devices having emitters coupled through logic to said bus node means to form open-emitter buses in which said devices only pull the bus node means to a high state level, and the applying of said reference voltage is effected by pulling the bus node means to a low state level, operating effectively as a two-state bus.

16. A method of diagnosing which of a plurality of electrical devices connected to common bus node means has failed, that comprises, disabling all said devices; pulling the voltage of the bus node means up or down; determining whether any of said devices is interfering with the bus operation during said pulling of the voltage of the bus node means; and, in the absence of such interfering, testing the normal operation of said devices.

17. A method of diagnosing which of a plurality of electrical devices connected to common bus node means has failed, that comprises, disabling all said devices; pulling the voltage of the bus node means up or down; determining whether any of said devices is interfering with the bus operation during said pulling of the voltage of the bus node means; and, in the event of such interfering, while disabling all said devices connected to a failing bus node of said bus node means, making a parametric measurement of such failing bus node; selecting one device of the plurality and driving the same to a failing state while maintaining the other devices of said plurality disabled; making a further parametric measurement of said failing bus node; comparing said parametric measurements to identify the said one device either as the failed device, or to select further devices for repeating the further parametric measurement and comparing steps ultimately to identify the failed device.

18. Apparatus for diagnosing which of a plurality of electrical devices connected to common bus node means has failed, having, in combination, means for disabling all said devices to cause the output of each operative device to assume an inactive state; means for applying reference voltage through resistive path means to the common bus node means; means for determining whether the voltage level at said bus node means is controlled by said resistive path means and reference voltage, or if a supposedly inactive device has failed and is thus actively forcing a different voltage level at said bus node means; means operable upon finding the forcing of such different voltage level, for disconnecting said resistive path means and reference voltage from said bus node means; means for driving a source or sink current through the said bus node means; means responding to said current for measuring the same with all said devices supposedly disabled; means for activating one of the devices to drive the said bus node means to a failing state while all the other devices remain supposedly inactive; means for re-measuring the source or sink current with the said activated device driving said bus node means; means for comparing the first and re-measured currents to determine if the currents are substantially the same within predetermined limits or different in order to identify the failed device as the said one activated device if the currents are substantially the same within said limits.

19. Apparatus as claimed in claim 18 and in which means is provided, operable in the event said currents are different for deactivating said one device and activating another of the devices to a failing state while all the remainder are disabled for further re-measuring and current comparison.

20. Apparatus as claimed in claim 19 and in which said substantially the same currents are currents either substantially identical or currents lying within predetermined limited percentages, and said different currents lie outside said percentages.

21. Apparatus as claimed in claim 20 and in which said electrical devices are tri-stable logic devices having logic 1 and 0 states and an inactive tristate, with the said disabling means comprising driver means enabling or disabling through appropriate logic state stimulation; said driver means being controllable to activate the said one device and to drive the same to a failing state.

22. Apparatus as claimed in claim 21 and in which the said devices are connected to bus node structures so that no device serves to provide source or sink current at the point of connection to said bus node structures.

23. Apparatus as claimed in claim 20 and in which said electrical devices include transistor-type devices embodying collectors and in which means is provided for coupling said collectors through appropriate logic to said bus node means to form open-collector buses in which said devices only pull the bus node means to a low state level, and said means for applying voltage through resistive path means pulls the bus node means to a high state level.

24. Apparatus as claimed in claim 23 and in which the means for applying reference voltage through resistive path means is effected through the resistor part of the bus means under test.

25. Apparatus as claimed in claim 20 and in which said electrical devices include transistor-type devices embodying emitters and in which the further steps are performed of coupling said emitters through appropriate logic to said bus node means to form open-emitter buses in which said devices only pull the bus node means to a high state level, and said means for applying voltage through resistive path means pulls the bus node means to a low state level.

26. Apparatus as claimed in claim 20 and in which said bus node means comprises a plurality of nodes and means is provided for operating said activating, measuring and comparing means concurrently in parallel at said plurality of nodes.

27. Apparatus as claimed in claim 21 and in which said disabling and activating means and said measuring and comparing means are operated in appropriate sequence by program-controlled microprocessor means to enable automatic fault finding.

28. Apparatus as claimed in claim 27 and in which said devices include integrated circuits, transistor and metal oxide semiconductor logic devices, connected with an in-circuit testing system for diagnosing proper operation of the same.

29. Apparatus as claimed in claim 20 and in which said devices comprise a totem-pole-connected transistor pair the junction of which is connected to said common bus node means.

30. Apparatus for diagnosing which of a plurality of electrical devices connected to a common bus node has failed, having, in combination, driver and logic means connected to said devices for disabling all said devices; means for pulling the voltage of the bus node up or down; means operable during the disabling of said devices for determining whether any of said devices is interfering with the bus operation during said pulling of the voltage of the bus node; and, means operable in the absence of such interfering for in-circuit testing the normal operation of said devices, said apparatus including microprocessor control means for controlling the operation of the above-said means in sequence.

31. Apparatus for diagnosing which of a plurality of electrical devices connected to a common bus node system has failed, having, in combination, drive and logic means connected to said devices for disabling all said devices; means for pulling the voltage of the bus node system up or down; means operable during the disabling of said devices for determining whether any of said devices is interfering with the bus operation during said pulling of the voltage of the bus node system; means for making a parametric measurement of a failing bus node, in the event of such interfering and during the disabling of all said devices connected to a failing bus node of said bus node system, means for selecting one device of the plurality and driving the same to a failing state while maintaining the other devices of said plurality disabled; means for making a further parametric measurement of said failing bus node; means for comparing said parametric measurements to identify the said one device either as the failed device, or to select further devices for re-operating the further parametric measurement and comparing means, ultimately to identify the failed device, said apparatus including microprocessor control means for controlling the operation of the above-said means in sequence.

* * * * *